US011694586B2

(12) United States Patent
Pan

(10) Patent No.: US 11,694,586 B2
(45) Date of Patent: Jul. 4, 2023

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventor: You Pan, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 434 days.

(21) Appl. No.: 17/051,095

(22) PCT Filed: Aug. 28, 2020

(86) PCT No.: PCT/CN2020/112061
§ 371 (c)(1),
(2) Date: Oct. 27, 2020

(87) PCT Pub. No.: WO2022/036745
PCT Pub. Date: Feb. 24, 2022

(65) Prior Publication Data
US 2023/0134038 A1    May 4, 2023

(30) Foreign Application Priority Data
Aug. 17, 2020   (CN) .......................... 202010824264.4

(51) Int. Cl.
G09G 3/20       (2006.01)
H01L 27/12      (2006.01)

(52) U.S. Cl.
CPC ............. *G09G 3/20* (2013.01); *H01L 27/124* (2013.01); *G09G 2300/0408* (2013.01); *G09G 2300/0426* (2013.01); *G09G 2310/0213* (2013.01)

(58) Field of Classification Search
None
See application file for complete search history.

(56) References Cited

U.S. PATENT DOCUMENTS

| 2007/0132700 | A1* | 6/2007 | Cho ........................ G11C 19/28 345/100 |
| 2018/0218699 | A1* | 8/2018 | Du ........................ G09G 3/3677 |
| 2020/0126501 | A1  | 4/2020 | Yamazaki et al. |

FOREIGN PATENT DOCUMENTS

| CN | 103730093 A | 4/2014 |
| CN | 103995369 A | 8/2014 |
| CN | 104637431 A | 5/2015 |
| CN | 106652948 A | 5/2017 |
| CN | 107678219 A | 2/2018 |
| CN | 108109598 A | 6/2018 |
| CN | 109637477 A | 4/2019 |
| CN | 110426900 A | 11/2019 |
| CN | 111383576 A | 7/2020 |

* cited by examiner

*Primary Examiner* — Ifedayo B Iluyomade

(57) ABSTRACT

A display panel and a display device are provided. The display panel and display device include gate driver on array (GOA) units in a first column, GOA units in a second column, and signal input lines. By adjusting a positional relationship between the signal input line and the GOA units in the first column and the GOA unit in the second column, the GOA units in the first column and the GOA units in the second column may share the signal input line, so as to save a set of signal input lines and reduce a width of the frame area.

20 Claims, 4 Drawing Sheets

DISPLAY PANEL AND DISPLAY DEVICE

BACKGROUND OF INVENTION

Field of Invention

The present invention relates to the field of display technology, and more particularly, to a gate driver on array (GOA) display technology, and specifically to a display panel and a display device.

Description of Prior Art

Gate driver on array (GOA) technology is a driving technology that fabricates scanning drive signal circuits on an array substrate by thin film transistor array processing to achieve column-by-column scanning.

The formed GOA circuits include a plurality of cascaded GOA units. In the prior art, at least one column of GOA units is disposed on one side of the display panel. In order to reduce vertical space, two columns of GOA units are disposed. For a display panel having two columns of GOA units, each column of GOA units needs to have an independent signal input line to provide input signals to the corresponding GOA unit. Obviously, this increases horizontal space of the display panel occupied by the GOA circuits. As a result, a width of frame area of the display panel is further increased.

SUMMARY OF INVENTION

A display panel and a display device are provided, which solves the technical problem that two columns of GOA units are disposed on one side of the display panel and corresponding signal input lines are configured, which causes a width of the frame area to increase.

In first aspect, a display panel comprises:

gate driver on array (GOA) units in a first column disposed on one side of the display panel;

GOA units in a second column disposed on the side of the display panel and on a same side with the GOA units in the first column; and signal input lines connected to the GOA units in the first column and the GOA units in the second column. The signal input lines are disposed between the first GOA units in the first column and the GOA units in the second column, and the signal lines are configured to provide a common input signal to the GOA units in the first column and the GOA units in the second column. Input terminals of GOA units in the first column and the GOA units in the second column face the signal input lines.

In one embodiment, the display panel comprises a display area and a non-display area defined at one side of the display area, and the GOA units in the first column, the GOA units in the second column, and the signal input lines are disposed in the non-display area.

In one embodiment, the GOA units in the first column, the signal input lines, and the GOA units in the second column are sequentially disposed from near to far from the display area.

In one embodiment, the GOA units in the first column, the signal input lines, and the GOA units in the second column are sequentially disposed from far to near the display area.

In one embodiment, output terminals of the GOA units in the first column face the display area, and output terminals of the GOA units in the second column face a opposite direction to the output terminals of the GOA units in the first column.

In one embodiment, output lines of the GOA units in the first column corresponding to the output terminals of the GOA units in the first column are disposed along a first direction; output lines of the GOA units in the second column corresponding to the output terminals of the GOA units in the second column are sequentially disposed along a direction opposite to the first direction, a second direction, and the first direction, and the first direction is perpendicular to the second direction.

In one embodiment, 8N+3 level GOA unit and 8N+5 level GOA unit are alternatively disposed in the GOA units in the first column in order along a second direction, and 8N+1 level GOA unit and 8N+7 level GOA unit are alternatively disposed in the GOA units in the second column in order along the second direction. An output line of the 8N+1 level GOA unit is sequentially disposed along a direction opposite to a first direction, the second direction, and the first direction. An output line of the 8N+7 level GOA unit is sequentially disposed along a direction opposite to the first direction, a direction opposite to the second direction, and the first direction, and N is an integer not less than zero.

In one embodiment, the 8N+1 level GOA unit and the 8N+3 level GOA unit are disposed in a same row; the 8N+5 level GOA unit and the 8N+7 level GOA unit are disposed in a same row; and the 8N+1 level GOA unit, the 8N+3 level GOA unit, the 8N+5 level GOA unit, and the 8N+7 level GOA unit are sequentially disposed in cascade.

In one embodiment, a second cascade input terminal of the 8N+3 level GOA unit is connected to an output line of the 8N+5 level GOA unit through a first polyline; a first cascade input terminal of the 8N+5 level GOA unit is connected to an output line of the 8N+3 level GOA unit through a second polyline; and the first polyline and the second polyline intersect in different layers.

In second aspect, a display device comprises a display area; and a non-display area defined at one side of the display area. The non-display area comprises gate driver on array (GOA) units in a first column disposed on one side of the display panel; GOA units in a second column disposed on the side of the display panel and on a same side with the GOA units in the first column; and signal input lines connected to the GOA units in the first column and the GOA units in the second column. The signal input lines are disposed between the GOA units in the first column and the GOA units in the second column, and the signal lines are configured to provide a common input signal to the GOA units in the first column and the GOA units in the second column. Input terminals of GOA units in the first column and the GOA units in the second column face the signal input lines.

The display panel/display device may adjust the positional relationship between the signal input line and the GOA units in the first column and the GOA unit in the second column, so that the GOA units in the first column and the GOA units L30 in the second column may share the signal input line, which can save a set of signal input lines L20, thereby reducing the width of the frame area.

DETAILED DESCRIPTION OF PREFERRED EMBODIMENTS

In order to make the purpose, technical solutions and effects of this application clearer and clearer, the following further describes this application in detail with reference to the drawings and embodiments. It should be understood that the specific embodiments described herein are only used to explain the application, and not used to limit the application.

Figure 1:
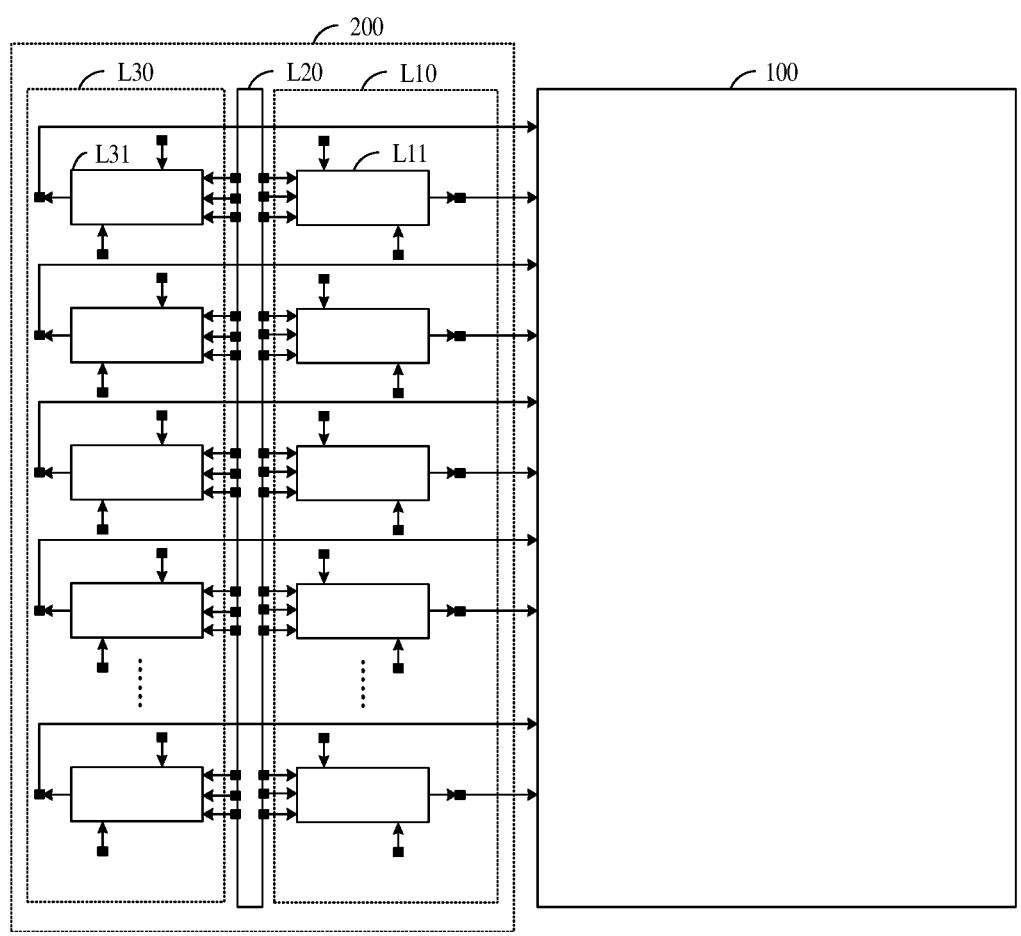
FIG. 1 is a schematic structural view of a display panel according to one embodiment of the present invention.
Figure 2:
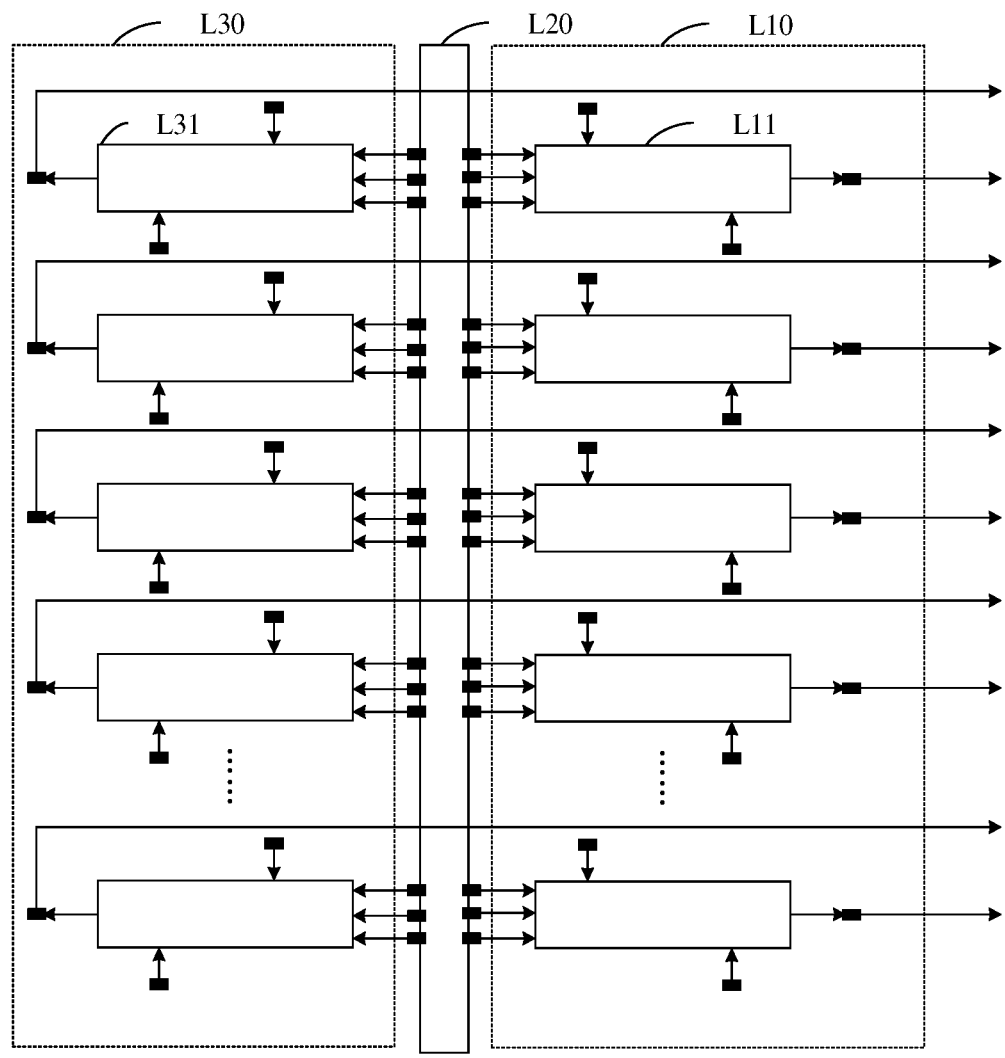
FIG. 2 is a schematic structural view of a first structure of a non-display area in the display panel shown in FIG. 1.

Referring to FIG. 1 or FIG. 2, a display panel comprises a gate driver on array (GOA) units L10 disposed in a first column, GOA units L30 in a second column, and signal input lines L20. The GOA units L10 in a first column are disposed on one side of the display panel. The GOA units L30 in a second column are disposed on the side of the display panel and on a same side with the GOA units L10 in the first column. The signal input lines are connected to the GOA units L10 in the first column and the GOA units L30 in the second column, and the signal input lines are disposed between the first GOA units L10 in the first column and the GOA units L30 in the second column, and the signal lines are configured to provide a common input signal to the GOA units L10 in the first column and the GOA units L30 in the second column. The input terminals of GOA units L10 in the first column and the GOA units L30 in the second column face the signal input lines.

It should be noted that the display panel/display device may comprise a GOA circuit, and the GOA circuit comprises a plurality of cascaded GOA units, each level of GOA unit correspondingly outputs a scan signal for connecting at least one pixel column in the display area 100, so as to realize pixels working column by column.

The display panel/display device may adjust the positional relationship between the signal input line L20 and the GOA units L10 in the first column and the GOA unit L30 in the second column, and adjusts the layout/position of the input terminal of corresponding GOA unit, so that the GOA units in the first column L10 and the GOA units L30 in the second column may share the signal input line L20, which can save a set of signal input lines L20, thereby reducing the width of the frame area.

The signal input line L20 is configured to transmit input signals. The input signal may comprise, but is not limited to, at least one of a high potential signal for turning on thin film transistors, a low potential signal for turning off thin film transistors, a clock signal, and other square wave signals.

Referring to FIG. 2, in one embodiment, the display panel comprises a display area 100 and a non-display area 200 defined at one side of the display area, and the GOA units L10 in the first column, the GOA units L30 in the second column, and the signal input lines L20 are disposed in the non-display area 200.

Referring to FIG. 2, the GOA units L10 in the first column, the signal input lines L20, and the GOA units L30 in the second column are sequentially disposed from near to far from the display area.

In one embodiment, the GOA units in the first column L10, the signal input lines L20, and the GOA units L30 in the second column are sequentially disposed from far to near the display area.

It can be seen from the above two embodiments that the signal input line L20 is disposed between the GOA units L10 in the first column and the GOA units L30 in the second column, and the GOA units in the first column L10 or the GOA units L30 in the second column closer to the display area 100 are correspondingly disposed, and are not limited herein.

In one embodiment, output terminals of the GOA units L10 in the first column face the display area 100, and output terminals of the GOA units L30 in the second column face a opposite direction to the output terminals of the GOA units L10 in the first column.

In one embodiment, output lines of the GOA units L10 in the first column corresponding to the output terminals of the GOA units L10 in the first column are disposed along a first direction; output lines of the GOA units L30 in the second column corresponding to the output terminals of the GOA units L30 in the second column are sequentially disposed along a direction opposite to the first direction, a second direction, and the first direction, and the first direction is perpendicular to the second direction.

It should be noted that the first direction refers to the arrangement direction from the non-display area 200 to the display area 100 and is parallel to the corresponding pixel column. The opposite direction of the first direction refers to the direction from the display area 100 to the non-display area 200 and is parallel to the arrangement direction of the corresponding pixel column. The second direction may, but is not limited to, a direction in which the first direction is rotated 90 degrees counterclockwise. It can also be understood that the opposite direction of the second direction may, but is not limited to, a direction rotated 90 degrees clockwise in the first direction.

In one embodiment, the first GOA units L11 of GOA units L10 in the first column and the second GOA units L31 of GOA units L30 in the second column are correspondingly disposed in parallel along the first direction.

It can also be understood that the GOA units L10 in the first column comprise a plurality of first GOA units L11 sequentially disposed in a direction opposite to the second direction; the GOA units L30 in the second column comprises a plurality of second GOA units L31 sequentially disposed in the direction opposite to the second direction; and each pair of first GOA unit L11 and second GOA unit L31 disposed in a same row, but in different columns, are parallel to each other.

In one embodiment, the signal input lines L20 are disposed along the second direction or a direction opposite to the second direction.

In one embodiment, the output lines and the signal input lines L20 of the GOA units L30 in the second column are disposed in different layers, and they cross or intersect with each other, but are not connected to each other. It can be understood that the output lines and the signal input lines L20 of the GOA units L10 in the first column do not cross or intersect with each other.

Figure 3:
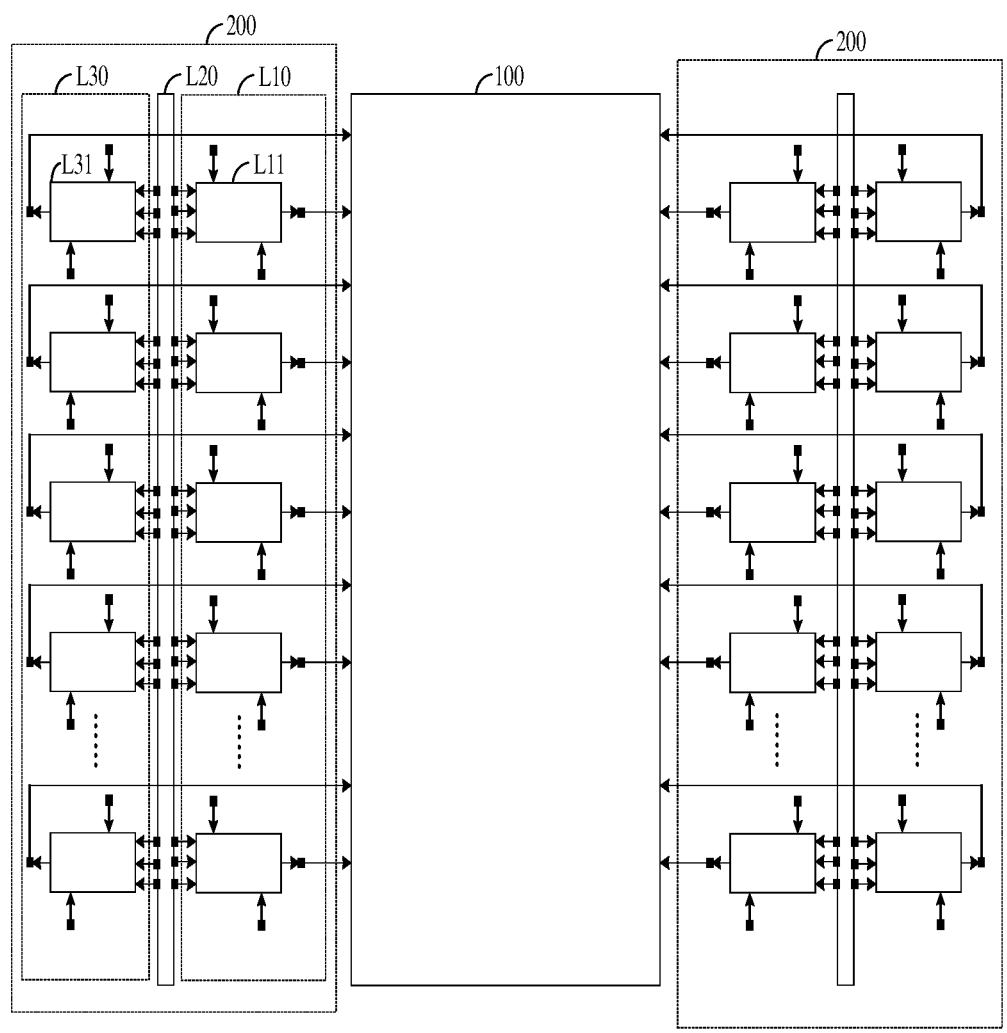
FIG. 3 is a schematic structural view of a display device according to one embodiment of the present invention.

Referring to FIG. 3, in one embodiment, a display device is provided, and comprises a display area 100 and a non-display area 200 disposed on one side of the display area 100. The non-display area comprises gate driver on array (GOA) units L10 in a first column, GOA units L30 in a second column, and signal input lines L20. The signal input lines L20 are connected to the GOA units L10 in the first column and the GOA units L30 in the second column, and the signal input lines are disposed between the first GOA units L10 in the first column and the GOA units L30 in the second column. The signal lines are configured to provide a common input signal to the GOA units L10 in the first column and the GOA units L30 in the second column. The input terminals of GOA units L10 in the first column and the GOA units L30 in the second column face the signal input lines L20.

It can be understood that the GOA units L10 in the first column, the GOA units L30 in the second column, and the signal input lines L20 in the non-display area 200 on both sides are symmetrically disposed. Alternatively, the number of the first GOA units L11 and the second GOA units L31 may not be equal.

The display panel/display device may adjust the positional relationship between the signal input line L20 and the GOA units L10 in the first column and the GOA unit L30 in the second column, and adjusts the layout/position of the input terminal of corresponding GOA unit, so that the GOA units in the first column L10 and the GOA units L30 in the second column may share the signal input line L20, which can save a set of signal input lines L20, thereby reducing the width of the frame area. In this embodiment, the non-display areas 200 on both sides may reduce the width of the frame area. In this way, the display panel/display device can reduce the width of the frame area more.

Figure 4:
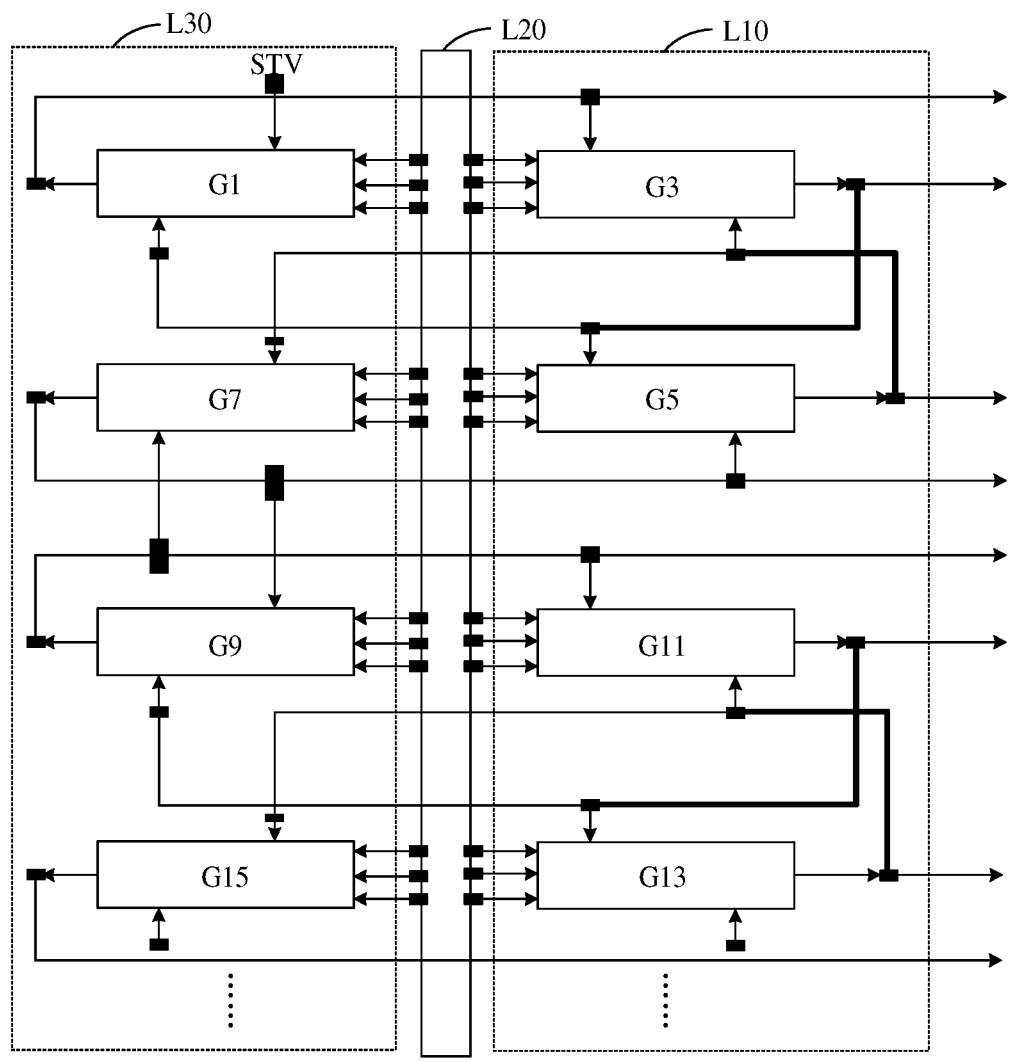
FIG. 4 is a schematic structural view of a second structure of a non-display area in a display panel according to one embodiment of the present invention.

Referring to FIG. 4, in one embodiment, 8N+3 level GOA unit and 8N+5 level GOA unit are alternatively disposed in the GOA units L10 in the first column in order along a second direction, and 8N+1 level GOA unit and 8N+7 level GOA unit are alternatively disposed in the GOA units L20 in the second column in order along the second direction. An output line of the 8N+1 level GOA unit is sequentially disposed along a direction opposite to a first direction, the second direction, and the first direction; and an output line of the 8N+7 level GOA unit is sequentially disposed along a direction opposite to the first direction, a direction opposite to the second direction, and the first direction, and N is an integer not less than zero.

For example, when N is equal to zero, the 8N+1 level GOA unit is the first level GOA unit G1; the 8N+3 level GOA unit is the third level GOA unit G3; the 8N+5 level GOA unit is the fifth level GOA unit G5; and the 8th N+7 level GOA unit is the seventh level GOA unit G7. When N is equal to 1, the 8N+1 level GOA unit is the 9th level GOA unit G9; the 8N+3 level GOA unit is the eleventh level GOA unit G11; the 8N+5 level GOA unit is the thirteenth level GOA Unit G13; and the 8N+7 level GOA unit is the fifteenth level GOA unit G15.

It should be noted that two GOA units may be disposed in one row. The 8N+1 level GOA unit and the 8N+3 level GOA unit are disposed in a same row; the 8N+5 level GOA unit and the 8N+7 level GOA unit are disposed in a same row; and the 8N+1 level GOA unit, the 8N+3 level GOA unit, the 8N+5 level GOA unit, and the 8N+7 level GOA unit are sequentially disposed in cascade.

Specifically, each GOA unit comprises a first cascade input terminal and a second cascade input terminal, and the first cascade input terminal is disposed above the corresponding GOA unit, and the second cascade input terminal is disposed below the corresponding GOA unit. When N is equal to zero, the first cascade input terminal of the 8N+1 level GOA unit is connected to the initial signal STY.

A second cascade input terminal of the 8N+3 level GOA unit is connected to an output line of the 8N+5 level GOA unit through a first polyline; a second cascade input terminal of the 8N+3 level GOA unit is further connected to a first cascade input terminal of the 8N+7 level GOA unit; and the first cascade input terminal of the 8N+3 level GOA unit is connected to the output line of the 8N+1 level GOA unit in the first direction. The first cascade input terminal of the 8N+5 level GOA unit is connected to the output line of the 8N+3 level GOA unit through the second polyline; and the first cascade input terminal of the 8N+5 level GOA unit is also connected to the second cascade input terminal of the 8N+1 level GOA unit. The first polyline is sequentially disposed from the second cascade input terminal of the 8N+3 level GOA unit along the first direction and the opposite direction of the second direction. The second polyline is sequentially disposed from the first cascade input terminal of the 8N+5 level GOA unit along the first direction and the second direction. It can be understood that the first polyline and the second polyline are disposed in different layers, and they cross each other, and are not electrically connected to each other. It should be noted that this arrangement of the first polyline and the second polyline can shorten the length of level transmission line between the 8N+3 level GOA unit and the 8N+5 level GOA unit without crossing the signal input line L20, which can reduce the interference of the signal input line L20 to the level transmission signal.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display panel, comprising:
   gate driver on array (GOA) units in a first column disposed on one side of the display panel;
   GOA units in a second column disposed on the side of the display panel and on a same side with the GOA units in the first column; and
   signal input lines connected to the GOA units in the first column and the GOA units in the second column, wherein the signal input lines are disposed between the first GOA units in the first column and the GOA units in the second column, and the signal lines are configured to provide a common input signal to the GOA units in the first column and the GOA units in the second column;
   wherein input terminals of GOA units in the first column and the GOA units in the second column face the signal input lines.

2. The display panel according to claim 1, wherein the display panel comprises a display area and a non-display area defined at one side of the display area, and the GOA units in the first column, the GOA units in the second column, and the signal input lines are disposed in the non-display area.

3. The display panel according to claim 2, wherein the GOA units in the first column, the signal input lines, and the GOA units in the second column are sequentially disposed from near to far from the display area.

4. The display panel according to claim 2, wherein the GOA units in the first column, the signal input lines, and the GOA units in the second column are sequentially disposed from far to near the display area.

5. The display panel according to claim 3, wherein output terminals of the GOA units in the first column face the display area, and output terminals of the GOA units in the second column face a opposite direction to the output terminals of the GOA units in the first column.

6. The display panel according to claim 5, wherein output lines of the GOA units in the first column corresponding to the output terminals of the GOA units in the first column are disposed along a first direction; output lines of the GOA units in the second column corresponding to the output terminals of the GOA units in the second column are sequentially disposed along a direction opposite to the first direction, a second direction, and the first direction, and the first direction is perpendicular to the second direction.

7. The display panel according to claim 3, wherein 8N+3 level GOA unit and 8N+5 level GOA unit are alternatively disposed in the GOA units in the first column in order along a second direction, and 8N+1 level GOA unit and 8N+7 level GOA unit are alternatively disposed in the GOA units in the second column in order along the second direction;
wherein an output line of the 8N+1 level GOA unit is sequentially disposed along a direction opposite to a first direction, the second direction, and the first direction; and
wherein an output line of the 8N+7 level GOA unit is sequentially disposed along a direction opposite to the first direction, a direction opposite to the second direction, and the first direction, and N is an integer not less than zero.

8. The display panel according to claim 7, wherein the 8N+1 level GOA unit and the 8N+3 level GOA unit are disposed in a same row; the 8N+5 level GOA unit and the 8N+7 level GOA unit are disposed in a same row; and the 8N+1 level GOA unit, the 8N+3 level GOA unit, the 8N+5 level GOA unit, and the 8N+7 level GOA unit are sequentially disposed in cascade.

9. The display panel according to claim 8, wherein a second cascade input terminal of the 8N+3 level GOA unit is connected to an output line of the 8N+5 level GOA unit through a first polyline; a first cascade input terminal of the 8N+5 level GOA unit is connected to an output line of the 8N+3 level GOA unit through a second polyline; and the first polyline and the second polyline intersect in different layers.

10. The display panel according to claim 6, wherein a first GOA unit of the GOA units in the first column and a second GOA unit of the GOA units in the second column are correspondingly disposed in parallel along the first direction.

11. The display panel according to claim 10, wherein the GOA units in the first column comprise a plurality of first GOA units sequentially disposed in a direction opposite to the second direction; the GOA units in the second column comprises a plurality of second GOA units sequentially disposed in the direction opposite to the second direction; and each pair of first GOA unit and second GOA unit disposed in a same row, but in different columns, are parallel to each other.

12. The display panel according to claim 10, wherein the signal input lines are disposed along the second direction.

13. The display panel according to claim 10, wherein the output lines and the signal input lines of the GOA units in the second column are disposed in different layers.

14. A display device, comprising:
a display area; and
a non-display area defined at one side of the display area;
wherein the non-display area comprises:
gate driver on array (GOA) units in a first column disposed on one side of the display panel;
GOA units in a second column disposed on the side of the display panel and on a same side with the GOA units in the first column; and
signal input lines connected to the GOA units in the first column and the GOA units in the second column, wherein the signal input lines are disposed between the GOA units in the first column and the GOA units in the second column, and the signal lines are configured to provide a common input signal to the GOA units in the first column and the GOA units in the second column;
wherein input terminals of GOA units in the first column and the GOA units in the second column face the signal input lines.

15. The display device according to claim 14, wherein 8N+3 level GOA unit and 8N+5 level GOA unit are alternatively disposed in the GOA units in the first column in order along a second direction, and 8N+1 level GOA unit and 8N+7 level GOA unit are alternatively disposed in the GOA units in the second column in order along the second direction.

16. The display device according to claim 15, wherein an output line of the 8N+1 level GOA unit is sequentially disposed along a direction opposite to a first direction, the second direction, and the first direction; and an output line of the 8N+7 level GOA unit is sequentially disposed along a direction opposite to the first direction, a direction opposite to the second direction, and the first direction, and N is an integer not less than zero.

17. The display device according to claim 15, wherein the GOA units in the first column, the signal input lines, and the GOA units in the second column are sequentially disposed from near to far from the display area.

18. The display device according to claim 15, wherein the GOA units in the first column, the signal input lines, and the GOA units in the second column are sequentially disposed from far to near the display area.

19. The display device according to claim 17, wherein output terminals of the GOA units in the first column face the display area, and output terminals of the GOA units in the second column face a opposite direction to the output terminals of the GOA units in the first column.

20. The display device according to claim 19, wherein output lines of the GOA units in the first column corresponding to the output terminals of the GOA units in the first column are disposed along a first direction; output lines of the GOA units in the second column corresponding to the output terminals of the GOA units in the second column are sequentially disposed along a direction opposite to the first direction, a second direction, and the first direction, and the first direction is perpendicular to the second direction.

* * * * *